United States Patent
Lo

(10) Patent No.: US 6,560,111 B1
(45) Date of Patent: May 6, 2003

(54) BRACKET FOR CPU COOLER

(75) Inventor: Chi Cheng Lo, Shu-Lin (TW)

(73) Assignee: Fang Tien Huang, Taipei (TW)

( * ) Notice: Subject to any disclaimer, the term of this patent is extended or adjusted under 35 U.S.C. 154(b) by 0 days.

(21) Appl. No.: 10/028,489

(22) Filed: Dec. 28, 2001

(51) Int. Cl.[7] .................................................. H05K 7/20
(52) U.S. Cl. ...................... 361/719; 165/80.3; 257/719; 361/703
(58) Field of Search ................................ 257/718, 719, 257/722, 726, 727; 174/16.3; 165/80.3, 121–126, 185; 248/505, 510; 454/184; 415/177, 178, 213.1, 214.1; 361/687, 695, 697, 703, 704, 705, 709–712, 717–719

(56) References Cited

U.S. PATENT DOCUMENTS

| | | | |
|---|---|---|---|
| 6,311,766 B1 * | 11/2001 | Lin et al. ................... | 165/80.3 |
| 6,341,644 B1 * | 1/2002 | Lo et al. ..................... | 165/80.3 |
| 6,404,633 B1 * | 6/2002 | Hsu ........................... | 361/703 |
| 6,419,008 B1 * | 7/2002 | Wu ............................ | 165/80.3 |
| 6,450,248 B1 * | 9/2002 | Chang ........................ | 165/80.3 |
| 6,466,443 B1 * | 10/2002 | Chen ........................... | 361/695 |

* cited by examiner

Primary Examiner—Gerald Tolin
(74) Attorney, Agent, or Firm—Troxell Law Office PLLC

(57) ABSTRACT

A reliable bracket for CPU cooler having a latched piece on each of four corners is provided. Bracket comprises a rectangular hollow frame, a flat area extended between frame and a central opening for supporting cooler, a lower surface of flat area being in proximity to CPU, four upright members on four corners of frame, an opening on each upright member, each opening being secured to corresponding latched piece; a tunnel on each corner of flat area; and a well on a lower part of each tunnel and including a channel aligned with tunnel. Tunnels and channels of wells are driven through by fasteners to secure bracket to mainboard.

4 Claims, 6 Drawing Sheets

BRACKET FOR CPU COOLER

BACKGROUND OF THE INVENTION

1. Field of the Invention

The present invention relates to CPU (central processing unit) cooler and more particularly to a bracket for CPU cooler with improved characteristics.

2. Description of Related Art

A conventional bracket for CPU cooler comprises a plurality of posts (formed of plastic material) having hooked ends secured on mainboard so that bottom of cooler can contact top surface of CPU. When a computer is powered, heat generated by the running CPU may be dissipated by a mini fan mounted on cooler. Such configuration is effective in the past due to low operating frequency of CPU. However, it is disadvantageous for currently available CPUs. This is because operating frequency of current CPU is very high, resulting in a high heat generation by CPU. For effectively dissipating such heat, RPM (revolution per minute) of fan has increased from about 6,000 to about 10,000. However, shaft of fan may be slightly bent and fan may not be perpendicular to CPU under such high speed operation of fan. This is caused mainly by not so high quality bearing, unreliable assembly, and poor wearability of shaft arrangement due to low cost of fan. All of above have adversely affected the heat dissipation performance of the cooler. Another technique for increasing the heat dissipation performance of cooler is to increase a distance from cooler to CPU. Once the distance is increased, however, fan is further away from CPU and the height of posts is also increased. As a result, fan and posts tend to vibrate strongly when fan is operating in high speed. This has a number of drawbacks such as noisy, significantly increase of CPU temperature due to incomplete contact between bottom of cooler and top surface of CPU, and abnormal shutdown of computer. The cause of above drawbacks is totally caused by the poor design of bracket (i.e., the plastic posts may bend in a high temperature environment.)

Thus, it is desirable to provide an improved bracket for CPU cooler in order to overcome the above drawbacks of prior art.

SUMMARY OF THE INVENTION

It is an object of the present invention to provide a bracket for a cooler of CPU mounted on a mainboard of computer, the cooler having a latched piece on each of four corners, the bracket comprising a rectangular hollow frame; a flat area extended between the frame and a central opening of the frame, the flat area being conformed to a bottom surface of the cooler so that an upper surface the flat area is engageable with the bottom surface of the cooler and a lower surface thereof is in proximity to a top surface of the CPU; four upright members on four corners of the frame; a square opening on each upright member, each opening being secured to the corresponding latched piece; a tunnel on each corner of the flat area; and a well on a lower part of each tunnel and comprising a channel aligned with the tunnel; wherein the tunnels and the channels of the wells are driven through by a plurality of fasteners to secure the bracket to the mainboard. By utilizing this bracket, a number of advantages are obtained such as quick assembly, reliable securing, and high heat dissipation performance.

In one aspect of the present invention, the well further comprises two spaced parallel ridges on a bottom for fastening the fastener therein.

The above and other objects, features and advantages of the present invention will become apparent from the following detailed description taken with the accompanying drawings.

DETAILED DESCRIPTION OF THE PREFERRED EMBODIMENTS

Figure 1:
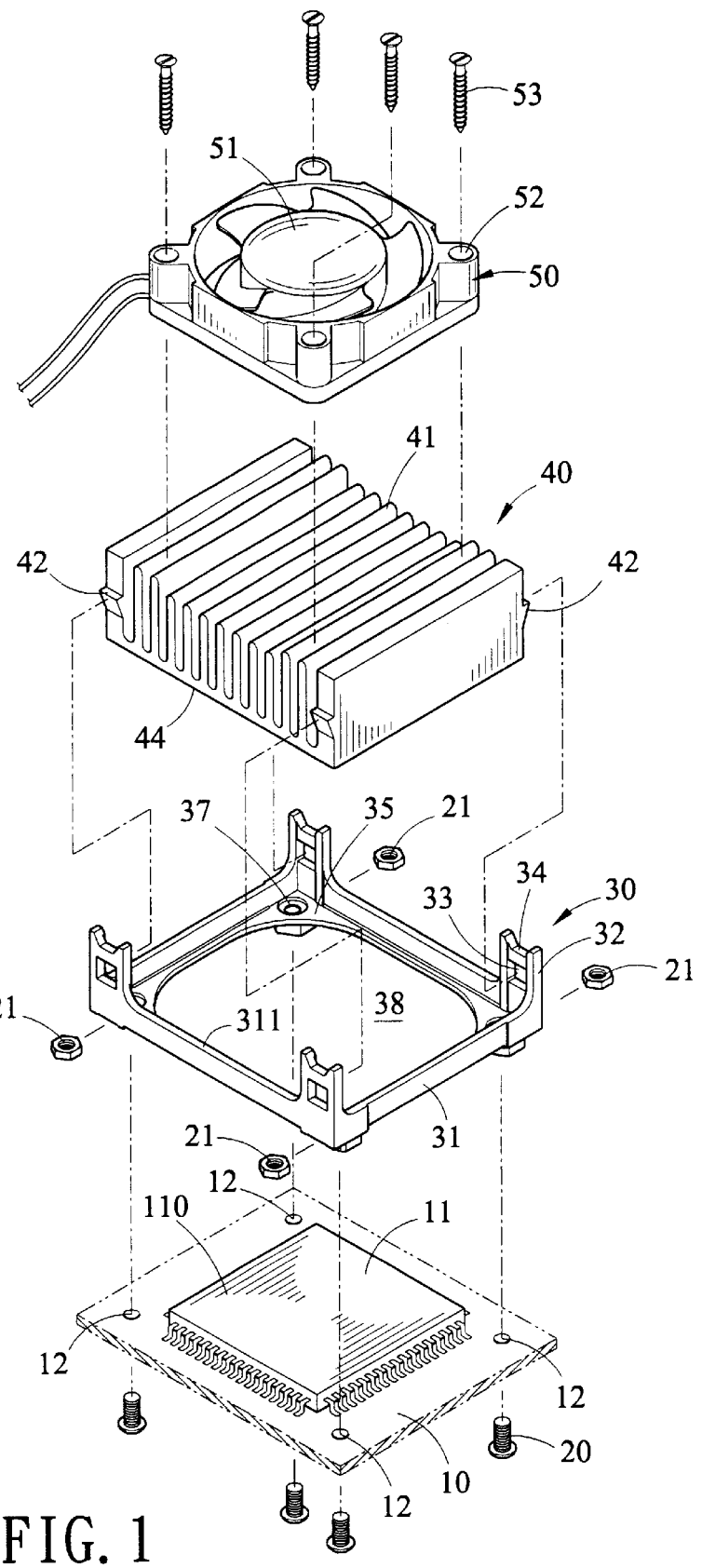
FIG. 1 is an exploded view of a CPU cooler incorporating a first preferred embodiment of bracket according to the invention.
Figure 2:
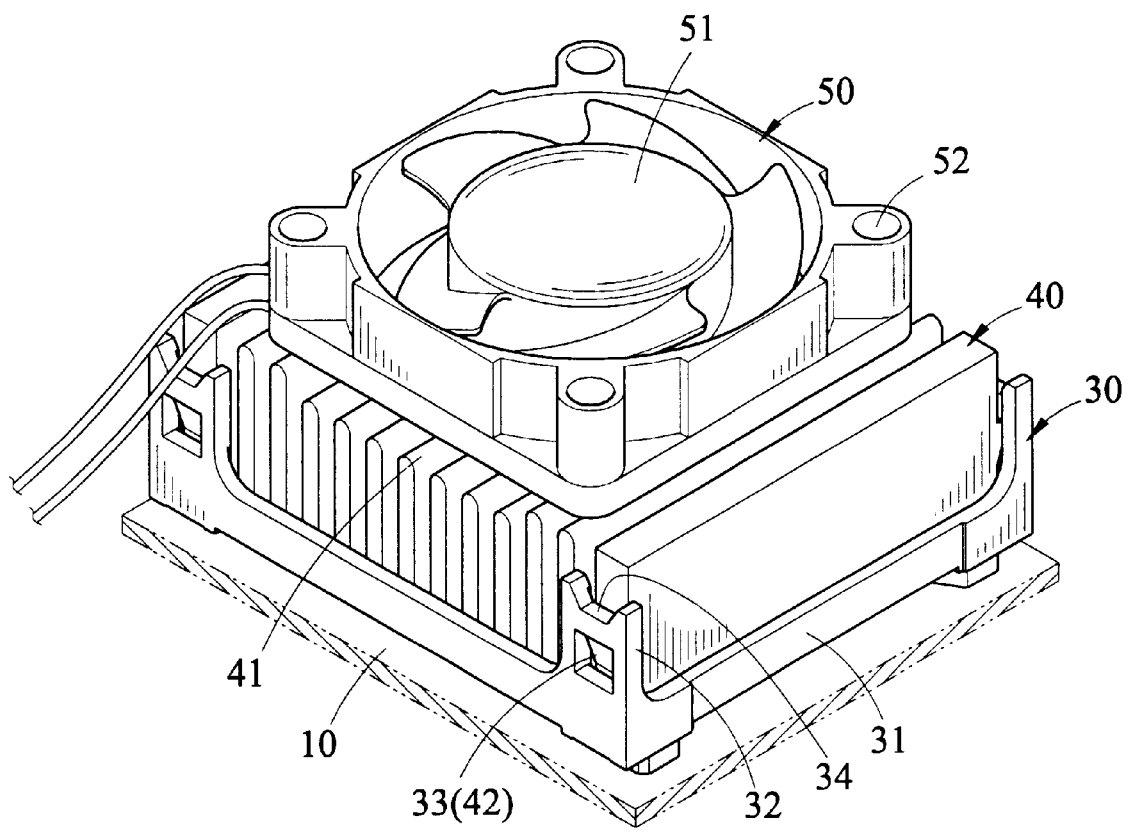
FIG. 2 is a perspective view of the FIG. 1 cooler mounted on mainboard of computer.
Figure 3:
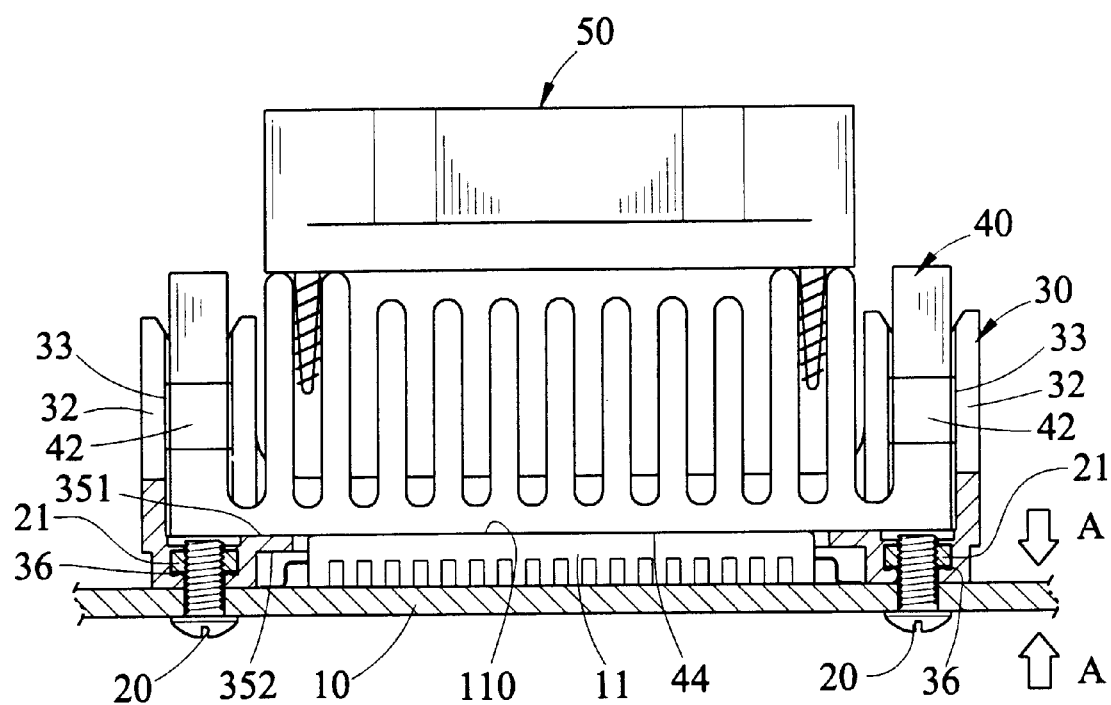
FIG. 3 is a cross-sectional view of FIG. 2.
Figure 4:
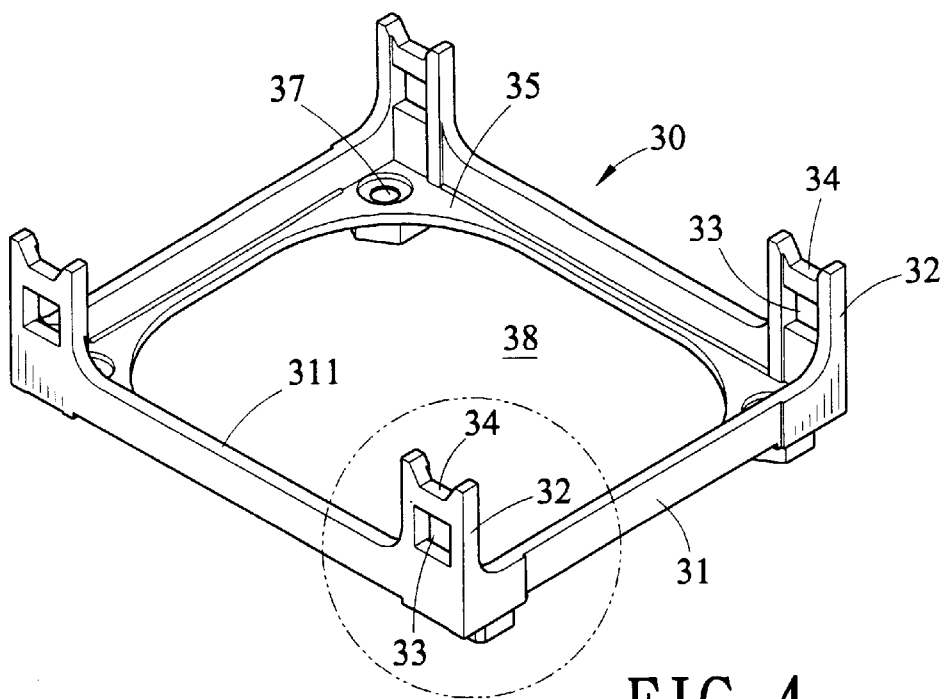
FIG. 4 is a perspective view of FIG. 1 bracket.
Figure 5:
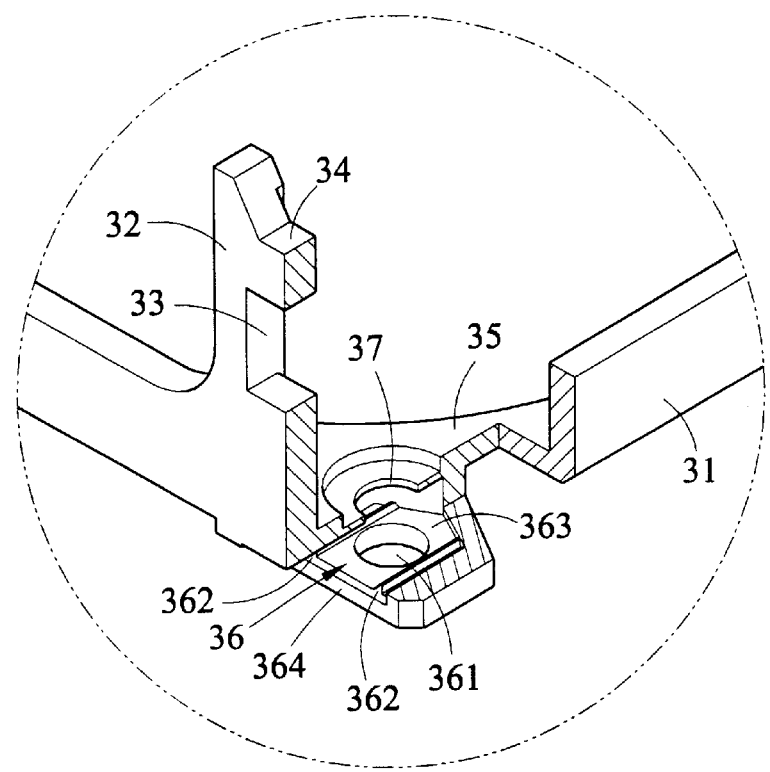
FIG. 5 is a fragmentary enlarged view in part section of circle indicated in FIG. 4.
Figure 6:
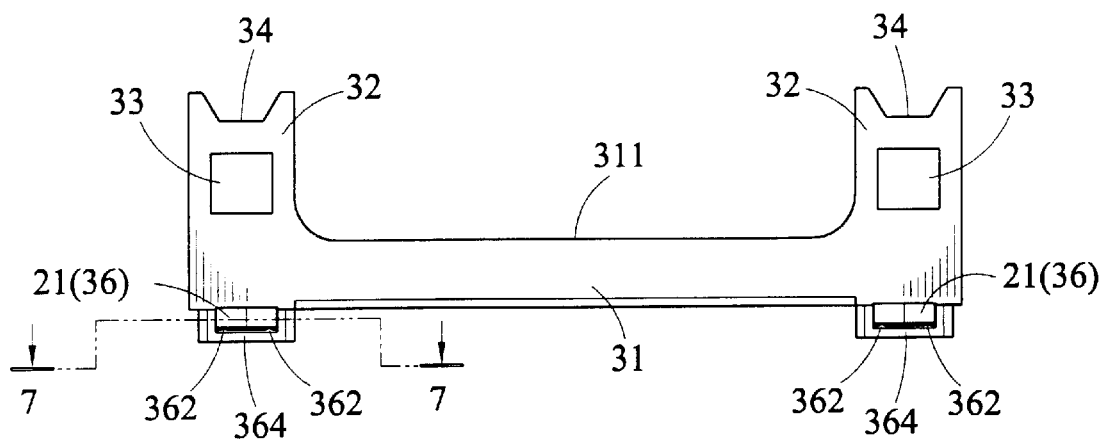
FIG. 6 is a side plan view of FIG. 4 bracket.
Figure 7:
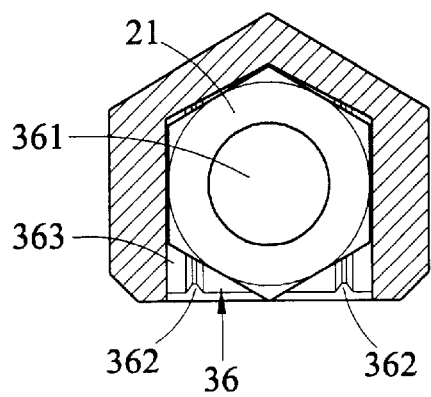
FIG. 7 is a cross-sectional view taken along line 7—7 of FIG. 6.

Referring to FIGS. 1 to 7, there is shown a CPU cooler 40 incorporating a first preferred embodiment of bracket 30 in accordance with the invention. Bracket 30 comprises a rectangular hollow frame 31 having four side frame elements 311, a flat area 35 extended between frame 31 and a central opening 38 wherein a lower surface of flat area 35 is below a top surface 110 of CPU, four short upright members 32 on four corners of frame 31, a square opening 33 on each upright member 32, a recess 34 above each opening 33 by a distance, a well 36 located at a lower part of each corner of flat area 35, and a tunnel 37 provided on each corner of the flat area 35, each well 36 having a channel 361 (see FIG. 5) aligned with each corresponding tunnel 37 and two spaced parallel ridges 362—362 on bottom 363 of each well 36 so as to have each of them fasten a nut 21 therein (see FIG. 3) through the inlet 364. CPU cooler 40 has a rectangular body conformed to flat area 35 and comprises a plurality of parallel fins 41 on top and a latched piece 42 on each corner secured to the corresponding opening 33 of each upright member 32 by snapping. A bottom surface 44 of cooler 40 is rested on flat area 35. Fan 50 also has a rectangular body and comprises four hollow posts 52 on four corners and a plurality of screws 53 each driven through a corresponding post 52 into gap between two adjacent fins 42 so as to secure fan 50 to cooler 40. CPU 11 having a flat top surface 110 is mounted on mainboard 10. A plurality of holes (four are shown) 12 formed on mainboard 10. A plurality of bolts (four are shown) 20 are driven through holes 12 to secure to nuts 21 received in wells 36. As a result, fan 50, cooler 40, and bracket 30 are secured on mainboard 10 and the bottom 44 of cooler 40 is firmly rested on the top surface 110 of CPU 11, as the area of top surface 110 of CPU 11 is smaller than the diamension of the central opening 38 so as to enable the top surface 110 of CPU 11 to be flush with or a little higher than the height of upper surface of flat area 35. This assembly is quick. Most importantly, the securing of bracket 30 is reliable and heat dissipation performance is high.

Figure 8:
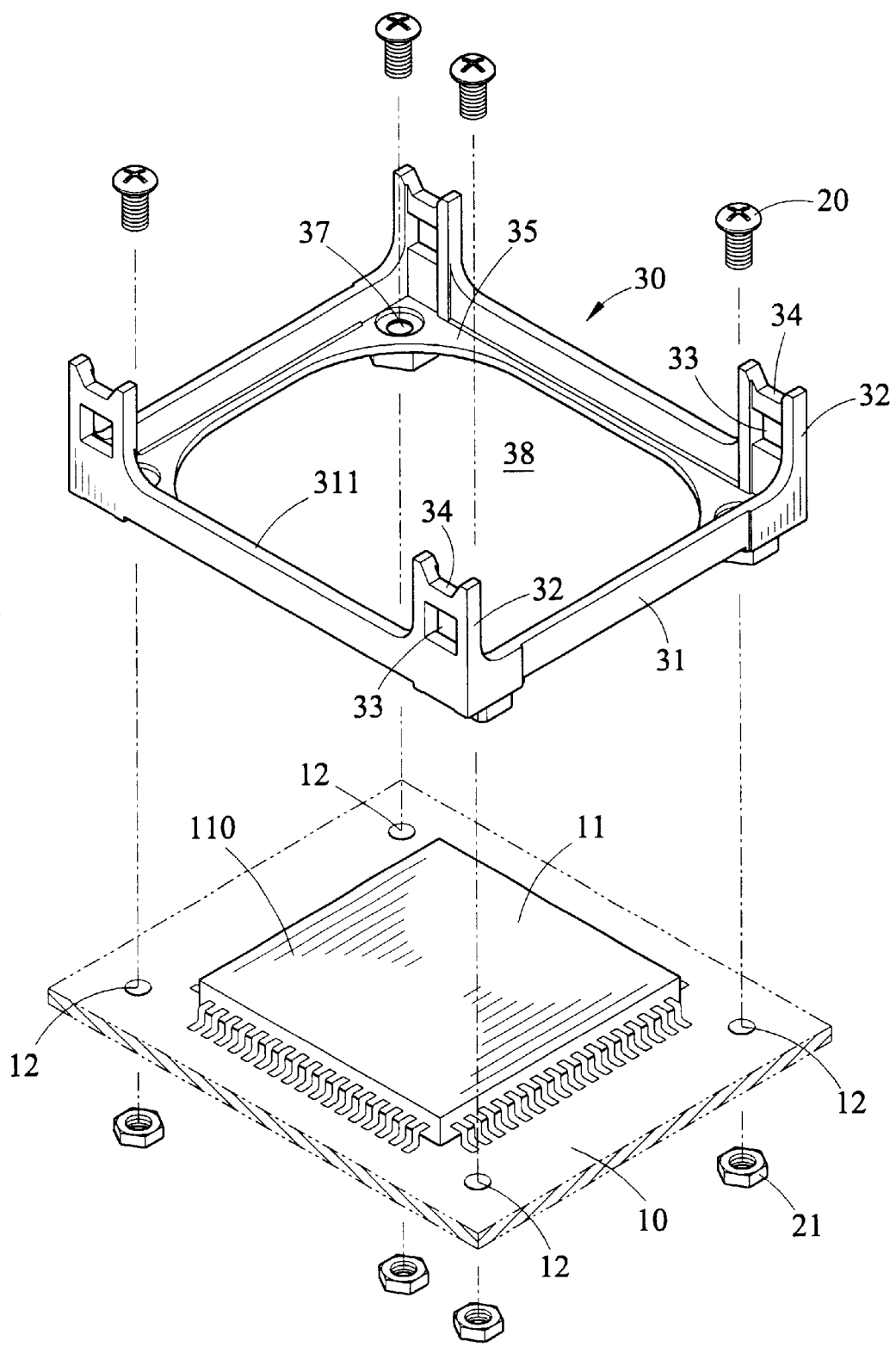
FIG. 8 is an exploded view of a second preferred embodiment of bracket for CPU cooler according to the invention.

Referring to FIG. 8, there is shown a CPU cooler incorporating a second preferred embodiment of bracket 30 in accordance with the invention. The only difference between first and second embodiments is that in second embodiment bolts 20 are driven from top through tunnels 37, wells 36, and holes 12 to secure to nuts 21 on the underside of mainboard 10.

While the invention herein disclosed has been described by means of specific embodiments, numerous modifications and variations could be made thereto by those skilled in the art without departing from the scope and spirit of the invention set forth in the claims.

What is claimed is:

1. A bracket for a cooler of CPU (central processing unit) mounted on a mainboard of computer, the cooler having a latched piece on each of four corners, the bracket comprising:
    a rectangular hollow frame having four side frame elements and a central opening;
    a flat area extended between the frame and the central opening of the frame, the flat area being conformed to a bottom surface of the cooler so that an upper surface the flat area is engageable with the bottom surface of the cooler and a lower surface thereof is below to a top surface of the CPU;
    four upright members on four corners of the frame;
    a square opening on each upright member, each opening being secured to the corresponding latched piece of the cooler;
    a tunnel on each corner of the flat area;
    a well on a lower part of each corner of the flat area and comprising a channel aligned with the tunnel; and
    a plurality of holes on a mainboard;
    wherein the tunnels and the channels of the wells are driven through the holes of mainboard to secure to nuts received in the well by a plurality of bolts from a bottom to a top of the bracket to firmly secure the bracket to the mainboard.

2. The bracket of claim 1, wherein the well further comprises two spaced parallel raised members on a bottom for fastening the nuts therein.

3. The bracket of claim 2, wherein each of the raised members has a gabled shape.

4. A bracket for a cooler of CPU (central processing unit) mounted on a mainboard of computer, the cooler having a latched piece on each of four corners, the bracket comprising:
    a rectangular hollow frame having four side frame elements and a central opening;
    a flat area extended between the frame and the central opening of the frame, the flat area being conformed to a bottom surface of the cooler so that an upper surface the flat area is engageable with the bottom surface of the cooler and a lower surface thereof is below to a top surface of the CPU;
    four upright members on four corners of the frame;
    a square opening on each upright member, each opening being secured to the corresponding latched piece of the cooler;
    a tunnel on each corner of the flat area;
    a well on a lower part of each corner of the flat area and comprising a channel aligned with the tunnel; and
    a plurality of holes on a mainboard;
    wherein the tunnels and the channels of the wells are driven through the holes of mainboard to secure to nuts on the underside of the mainboard received in the well by a plurality of bolts from a top to a bottom of the bracket to firmly secure the bracket to the mainboard.

\* \* \* \* \*